(12) United States Patent
Nakajima

(10) Patent No.: US 6,417,516 B1
(45) Date of Patent: Jul. 9, 2002

(54) ELECTRON BEAM LITHOGRAPHING METHOD AND APPARATUS THEREOF

(75) Inventor: Ken Nakajima, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/534,295

(22) Filed: Mar. 23, 2000

(30) Foreign Application Priority Data

Mar. 26, 1999 (JP) ............................................. 11-084209

(51) Int. Cl.[7] .............................. G21G 5/00; A61N 5/00
(52) U.S. Cl. ................................ 250/492.3; 250/492.1; 250/492.2; 250/492.22
(58) Field of Search ......................... 250/492.1, 492.2, 250/492.22, 492.3

(56) References Cited

U.S. PATENT DOCUMENTS 6,204,509 B1 * 3/2001 Yahiro et al. ............. 250/491.1

FOREIGN PATENT DOCUMENTS

| JP | 59-124127 | 7/1984 |
|---|---|---|
| JP | 62-14089 | 3/1987 |
| JP | 62-271424 | 11/1987 |
| JP | A 64-89427 | 4/1989 |
| JP | A 2-125609 | 5/1990 |
| JP | A 4-237115 | 8/1992 |
| JP | 6-204105 | 7/1994 |
| JP | A 7-142352 | 6/1995 |
| JP | 07153680 A * | 6/1995 |
| JP | 7-111951 | 11/1995 |
| JP | 10-4060 | 1/1998 |
| JP | 10-32188 | 2/1998 |
| JP | 10-41223 | 2/1998 |
| JP | A 11-54413 | 2/1999 |

OTHER PUBLICATIONS

J. A. Liddle et al., "The SCattering with Angular Limitation in Projection Electron–Beam Lithography (SCALPEL) System", Jpn. J. Appl. Phys. vol. 34 (1995) pp. 6663–6671, Part 1, No. 12B.

J.A. Liddle et al., "Mask fabrication for projection electron–beam lithography incorporating the SCALPEL technique", J. Vac. Sci. Technol. B, vol. 9, No. 6, 1991, pp. 3000–3004.

* cited by examiner

Primary Examiner—John R. Lee
Assistant Examiner—David A Vanore
(74) Attorney, Agent, or Firm—Young & Thompson

(57) ABSTRACT

An electron beam lithographing method for exposing and lithographing a desired pattern with an electron beam includes the steps of forming a plurality of accuracy evaluation patterns and a desired pattern in a stripe connection boundary area so as to form an electron beam mask, and measuring connection errors of the exposed stripes with the accuracy evaluation patterns.

14 Claims, 5 Drawing Sheets

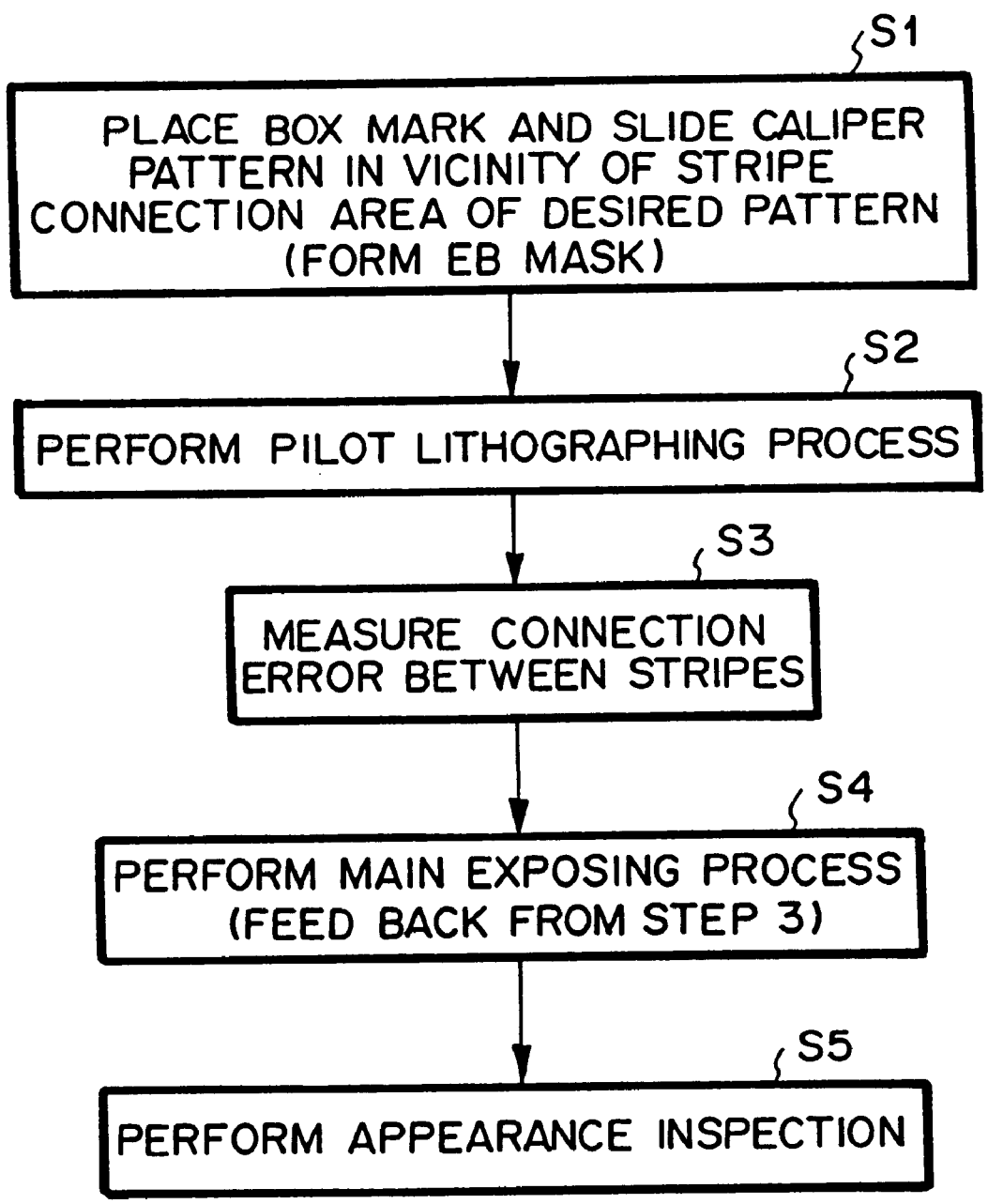

ELECTRON BEAM LITHOGRAPHING METHOD AND APPARATUS THEREOF

BACKGROUND OF THE INVENTION

1. Field of the Invention

The present invention relates to an electron beam lithographing method, in particular, to an electron beam lithographing method and an electron beam lithographing apparatus suitable for a large size of semiconductor integrated device and a high integration thereof.

2. Description of the Related Art

In recent years, as the size and integration of devices are becoming large, narrow exposed patterns are required. To satisfy that, a high throughput electron beam lithographing system has been proposed. An example of such a system is SCALPEL system. The SCALPEL stands for the SCattering with Angular Limitation in Projection Electron beam Lithography. In the electron beam lithographing system, each exposure field (stripe) (having a width of several millimeters) is scanned and exposed with a prepared electron beam (EB) mask. Thus, since the exposure stripes are connected, the connection adjusting method and the TAT (turn around time) thereof should be considered.

FIGS. 1A and 1B are schematic diagrams showing the structure of a conventional SCALPEL type electron beam lithography apparatus.

In FIG. 1A, an electron beam radiated by an electron gun scans a strutted mask 11 that causes the electron beam to strut. The electron beam that passes through the strutted mask 11 is controlled by projector lenses 12 and 13 so as to form a lithography pattern corresponding to the mask on a semiconductor wafer 14.

FIG. 1B shows a feed-back operation of the apparatus. In FIG. 1B, the projector lens 12 and 13 has a SCALPEL aperture 121 and a beam deflecting portion 131. A controlling system 16 controls the current, phase, and so forth of the beam deflecting unit 131 with the amount of beam detected by a BSE detecting portion 19, an output signal of an interferometer 17 that detects the amount of beam and the position of the mask 11, and an output signal of an interferometer 18 that detects the position of the wafer 14. By scanning a focused electron beam to a photosensitive resist that is formed on a wafer that is a semiconductor substrate and then developing the resist, a predetermined resist pattern can be formed.

The mask and wafer are mechanically scanned through the illumination during an exposure in order to reach all patterned portions of the mask (FIG. 1A). In order to achieve overlay, the positions of both stages area inter-ferometrically monitored in real time. Relative stage position errors are determined and corrected using a stitching deflector. Such an error correction scheme is used in write-on-the-fly direct write systems, and has also been employed in electron beam proximity printers (P. Nehmiz, W. Zapka, U. Behringer, M. Kallmeyer and H. Bolen: J. Vac. Sci. & Technol. B3 (1985) 136). FIG. 1B shows, schematically, how this process works.

Previous attempts (M. B. Heritage: J. Vac. Sci. & Technol. 12 (1975) 1135; J. Frosien, B. Lischke and K. Anger: J. Vac. Sci. & Technol. 16 (1979) 1827); T. Asai, S. Ito, T. Eto and M. Migitake: Jpn. J. Appl. Phys. 19 (1980) 47) to construct high-throughput projection electron beam lithographing systems have utilized step-and-repeat writing strategies, which require that the electron optical system be capable of illuminating and projecting a mask area of at least one full die.

The optical performance of these early systems was optimized, principally, by balancing diffraction effects against curvature of field (H. W. P. Koope: Microelectron. Eng 9 (1989) 217). Such an approach typically leads to the use of relatively small numerical apertures as a means of reducing aberrations. However, in order to achieve economically viable throughput levels, the beam current must be maximized, which means that electron-electron interaction effects must be considered (A. N. Broers and H. C. Pfeiffer: Proc. 11th Symp. on Electron Ion and Laser Beam Technology (San Francisco, 1971)). One of these effects is an uncorrectable image blur, which has a similar functional form to the diffraction limit, but whose magnitude is dependent on the beam current (L. R. Harriott, S. D. Berger, J. A. Liddle, G. P. Watson and M. M. Mkrtchyan: to be published in J. Vac. Sci. & Technol). When the type of full-field electron optical system previously considered is optimized taking this effect into account, it is found that the beam current must be held to impractically low levels in order to maintain acceptable resolution.

A related art reference for evaluating the accuracy of an electron beam lithographing process has been proposed as Japanese Patent Laid-Open Publication No. 59-124127. In the related art reference, an electron beam exposing pattern evaluating method is disclosed. In the electron beam exposing pattern evaluating method, an evaluation pattern is lithographed. An evaluation pattern area is disposed outside a real pattern area. An evaluation pattern is lithographed at intervals of a predetermined number of fields. By detecting the evaluation patterns, the lithography accuracy of the predetermined pattern is evaluated.

In the related art reference proposed as Japanese Patent Laid-Open Publication No. 59-124127, the evaluation pattern area is disposed outside the real pattern area. On the other hand, according to the present invention, an accuracy evaluation pattern is formed in a stripe connection boundary area. Thus, the technology of the related art reference proposed as Japanese Patent Laid-Open Publication No. 59-124127 is different from that of the present invention.

A related art reference for exposing a pattern with an electron beam has been proposed as Japanese Patent Laid-Open Publication No. 62-271424. In the related art reference, a charged beam exposing method is disclosed so as to form a pattern that connects fields with high accuracy. The charged beam exposing method comprises the steps of (a) exposing a pattern for measuring the accuracy of connections of fields, (b) forming a resist pattern for measuring the accuracy of the connections of the fields, (c) measuring the accuracy of the connections of the fields, and (d) inputting a compensation parameter to a deflecting unit of a charged beam exposing apparatus so as to expose a predetermined pattern.

In the related art reference proposed as Japanese Patent Laid-Open Publication No. 62-271424, the pattern for measuring the accuracy of the connections of the fields is exposed through a field boundary. On the other hand, according to the present invention, a pattern for evaluating the accuracy is formed in a stripe connection boundary area. Thus, the technology of the related art reference is different from that of the present invention.

A related art reference for exposing a pattern with an electron beam has been proposed as Japanese Patent Laid-Open Publication No. 6-204105. In the related art reference, an exposing method is disclosed so as to improve the overlap accuracy of the connected portion of adjacent shot areas. The exposing method comprises the steps of (a) exposing a transfer pattern image and an alignment mark image to a first shot area of a photosensitive substrate with a first mask having the transfer pattern and the alignment mark; (b) detecting the position of the alignment mark image when the first mask pattern image or a second mask pattern image is exposed in a second shot area corresponding to the first shot area on the photosensitive substrate in such a manner that the first mask pattern image or the second mask pattern image is connected to the transfer pattern image; and (c) aligning the mask of which the transfer pattern is formed in the second short area with the photosensitive substrate corresponding to the detected result.

In the related art reference proposed as Japanese Patent Laid-Open Publication No. 6-204105, when the first mask pattern image or the second mask pattern image is exposed in the second shot area, the alignment mark image that has been exposed is re-exposed. Thus, the alignment mark image that has been exposed and formed in the first shot area is erased. In the lithography connecting method, the exposed area of the photosensitive substrate is effective used. With an alignment mark in a field that has been just exposed, the next field is exposed. On the other hand, according to the present invention, an accuracy evaluation pattern is formed in a pilot exposed stripe connection boundary area. Thus, the technology of the related art reference is different from that of the present invention.

A related art reference for measuring connection accuracies of patterns exposed with an electron beam has been proposed as Japanese Patent Examined Publication No. 62-14089. In the related art reference, a method for measuring connection accuracies of patterns exposed with an electron beam is disclosed so as to easily measure connection accuracies of fields in the parallel direction and the vertical direction of the boundary of the fields with a scale reading operation and a simple calculation. A pair of a main scale line and a sub scale line are exposed in such a manner that the direction of the first scale line is perpendicular to the direction of the second scale line and that these scale lines have an angle of 45 degrees against the boundary. By observing the first and second scale lines, the connection accuracies in the parallel direction and the perpendicular direction of the boundary are measured.

In the related art reference proposed as Japanese Patent Examined Publication 62-14089, the scale lines are exposed in such a manner that the direction of the first scale line is perpendicular to the direction of the second scale line and these scale lines have an angle of 45 degrees against the boundary. On the other hand, according to the present invention, □-shaped box marks and square-shaped box marks are formed. Thus, the technology of the related art reference is different from that of the present invention.

A related art reference for measuring connection accuracies of patterns exposed with an electron beam has been proposed as Japanese Examined Patent Publication No. 7-111951. In the related art reference, a method for measuring connection accuracies of patterns exposed with an electron beam is disclosed so as to directly read a connection accuracy in the vertical direction and omit the use of a line width measuring unit. In the related art reference, a main scale is composed of a plurality of patterns that are straight lines that have a predetermined length and that are perpendicular to an exposed area boundary. The adjacent straight lines are formed at predetermined increasing intervals from the exposed area boundary. A sub scale is composed of a plurality of patterns that are straight lines that have a predetermined length and that are perpendicular to the exposed area boundary. The patterns of the sub scale are formed adjacent to the exposed area boundary. As reference patterns, the same patterns as the main scale and the sub scale are used corresponding to a reference line in parallel with a boundary line of the exposed area boundary.

In the related art reference proposed as Japanese Examined Patent Publication No. 7-111951, the plurality of exposed patterns of the main scale and the sub scale are straight lines. On the other hand, according to the present invention, □-shaped box marks or square-shaped box marks are formed.

A related art reference for measuring connection accuracies of patterns lithographed with an electron beam has been disclosed as Japanese Patent Laid-Open Publication No. 2-5407. In the related art reference, an exposing method is disclosed. In the related art reference, a technology for directly lithographing patterns with avariable electron beam (EB). According to the related art reference, corresponding to pattern data, a square EB is formed for each pattern without a mask. With the square EB, each pattern is exposed. In the related art reference, slide caliper pattern may be used EB data. In addition, an electron beam is deflected for each square of a plurality of line patterns that compose each slide caliper pattern and each square is directly lithographed (exposed). Thus, along with a distortion of the exposed field, a deflection error of the deflected electron beam is superimposed. Thus, it is difficult to accurately measure a connection error.

FIG. 2 shows a conventional electron beam lithographing method. In FIG. 2, desired patterns 1 and 2 are lithographed in a chip. At a stripe boundary of the chip, a connection error of the desired patterns is measured by a direct line width measuring SEM (Scanning Electron Microscope). The measured connection error is fed back to the main exposing process. The connection error should be measured in each wafer and between two wafers as well as in a chip using the line width measuring SEM. Thus, it takes several hours to measure the connection error. In addition, since the connection error should be manually measured, the measured results are not quantitatively obtained. In addition, along adjustment time is required. Moreover, the connection accuracy deteriorates. In the sectional view of the SCALPEL mask shown in FIG. 2, reference numeral 7 is a membrane (nitride film). Reference numeral 8 is a scattering member (heavy metal). The SCALPEL mask is an EB transferring mask of which a desired pattern of the scattering member (heavy metal) 8 is formed on the membrane 7. Unlike with the conventional method for directly lithographing patterns with a variable electron beam (EB), in the SCALPEL method, an image is transferred with a prepared EB mask.

However, the above-described related art references have the following problem.

As described above, in the high throughput electron beam lithographing method, each field (stripe) is scanned and exposed with a prepared EB mask. Since exposed strips are connected, countermeasures against the connected stripes and the TAT thereof should be taken. In the electron beam lithographing method according to each related art reference, the connection accuracy of each exposed stripe is not sufficient.

SUMMARY OF THE INVENTION

An object of the present invention is to provide an electron beam lithographing method that allows connection adjustment time for exposed stripes to be shortened and the connection accuracy to be improved.

The present inventions is an electron beam lithographing method for exposing and lithographing a desired pattern with an electron beam comprising the steps of (a) forming a plurality of accuracy evaluation patterns and a desired pattern in a stripe connection boundary area so as to form an electron beam mask, (b) lithographing patterns with the electron beam mask, (c) measuring connection errors of the exposed stripes with the accuracy evaluation patterns, (d) exposing the patterns with the electron beam, and (e) inspecting the connections of the pattern that has been exposed.

With reference to FIG. 4, the present inventions is an electron beam lithographing method for exposing and lithographing a desired pattern with an electron beam comprising the steps of (a) forming a plurality of accuracy evaluation patterns and a desired pattern in a stripe connection boundary area so as to form an electron beam mask (step S1 shown in FIG. 4), (b) lithographing patterns with the electron beam mask (step S2 shown in FIG. 4), (c) measuring connection errors of the exposed stripes with the accuracy evaluation patterns (step S3 shown in FIG. 4), (d) exposing the patterns with the electron beam (step S4 shown in FIG. 4), and (e) inspecting the connections of the pattern that has been exposed (step S5 shown in FIG. 4).

In the electron beam lithographing method according to the present invention, a plurality of accuracy evaluation patterns (box marks and slide caliper patterns) and a desired pattern are formed at a stripe boundary (exposed area) of a full transfer type or large area transfer type electron beam mask. With the electron beam mask, the stripe connected portions are overlapped and exposed. Thus, by quantitatively measuring accuracy evaluation patterns such as box marks or slide caliper patterns using an optical microscope or an automatic measuring unit, the connection adjustment time of exposed strips can be shortened and the connection accuracy can be improved.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 4 is a flow chart showing a process for the electron beam lithographing method according to the embodiment of the present invention.

DESCRIPTION OF PREFERRED EMBODIMENT

Figure 1A:
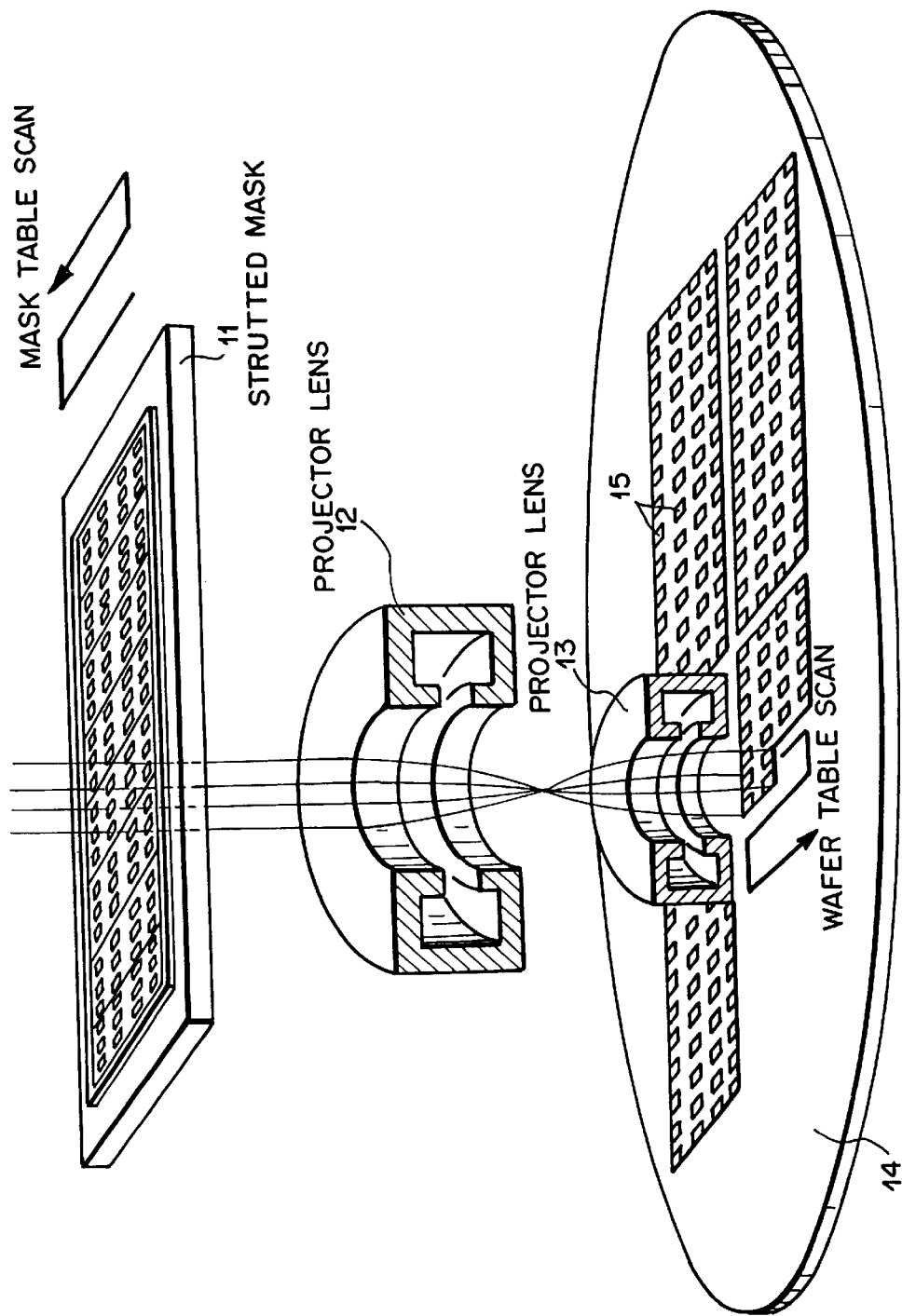
FIGS. 1A and 1B are schematic diagrams for explaining the conventional electron beam lithographing method.
Figure 1B:
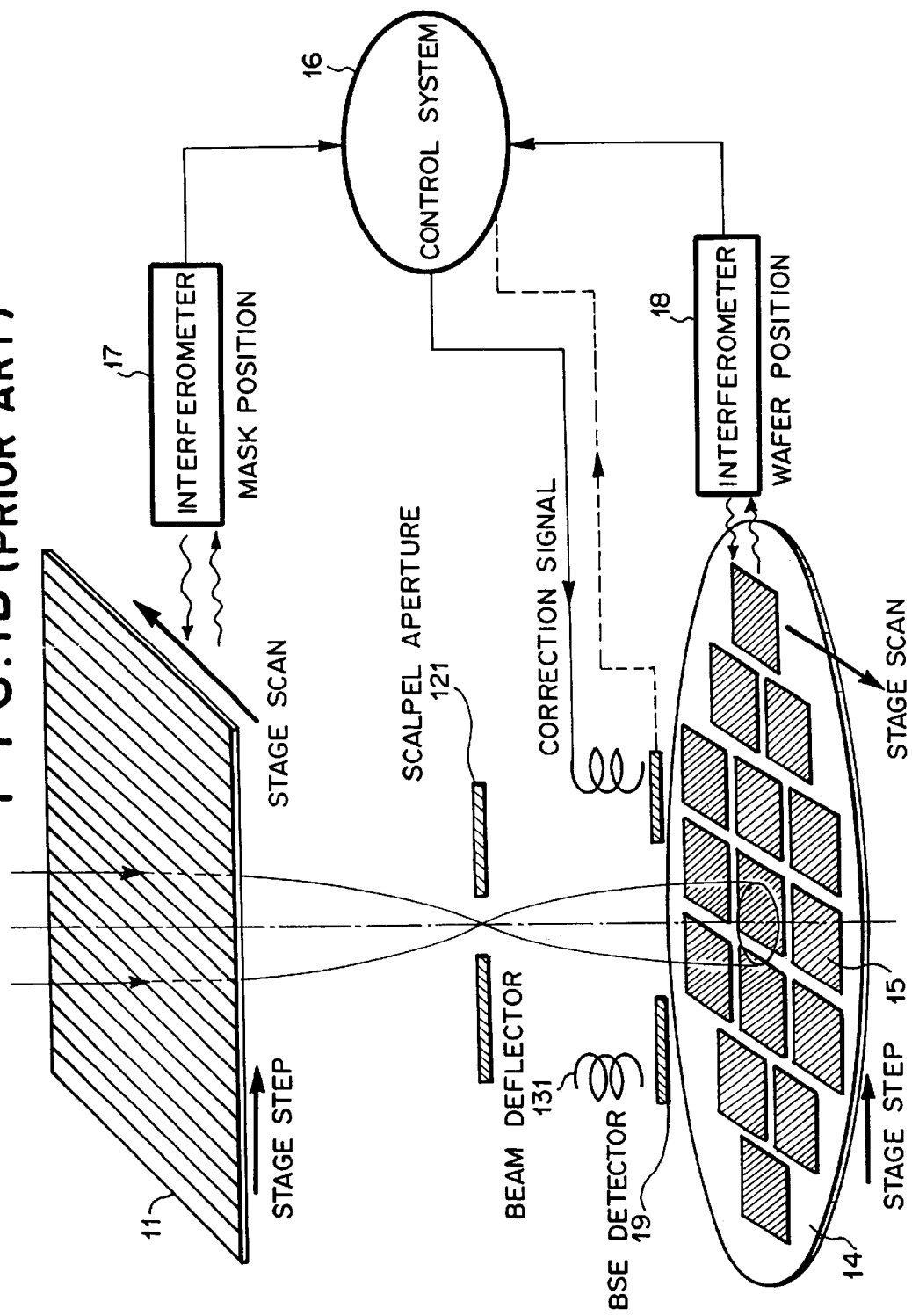
Figure 2:
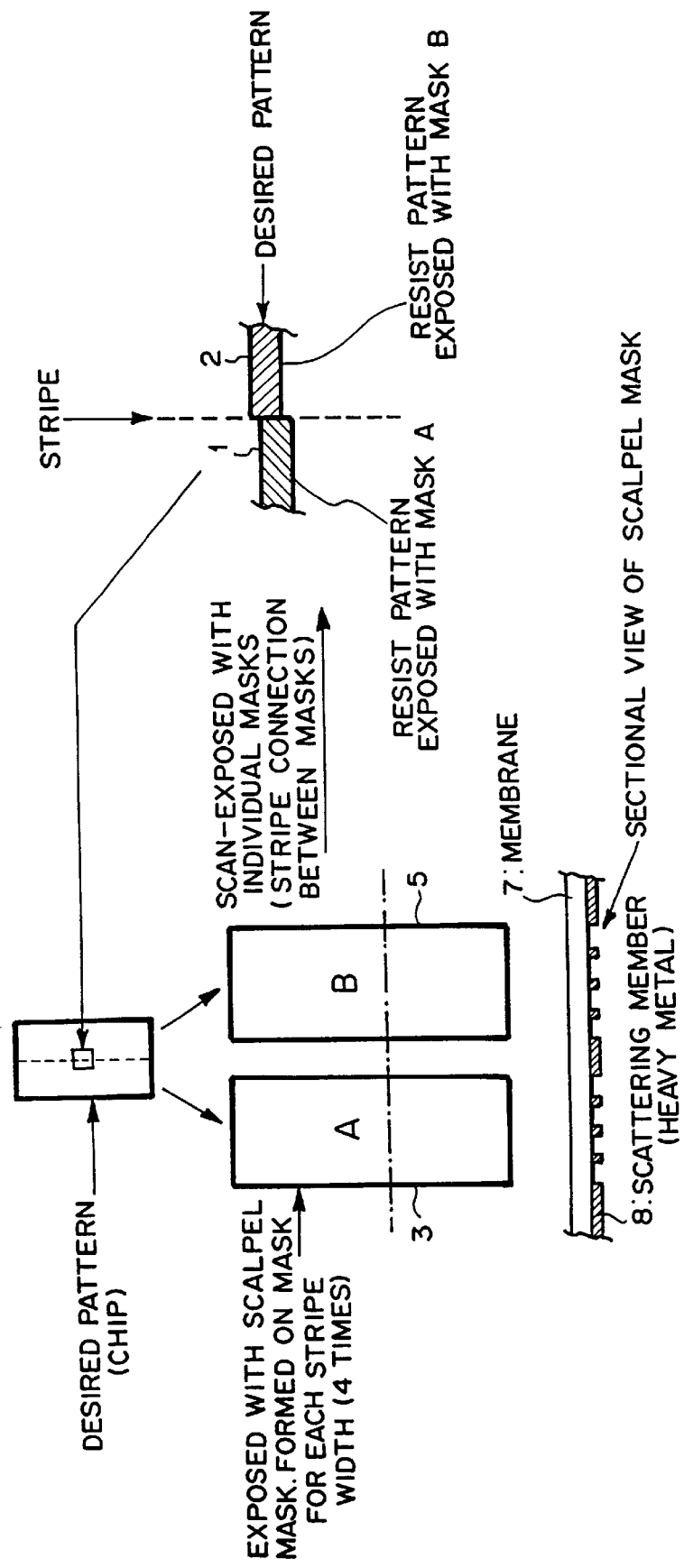
FIG. 2 is a schematic diagram for explaining a conventional electron beam lithographing method.
Figure 3:
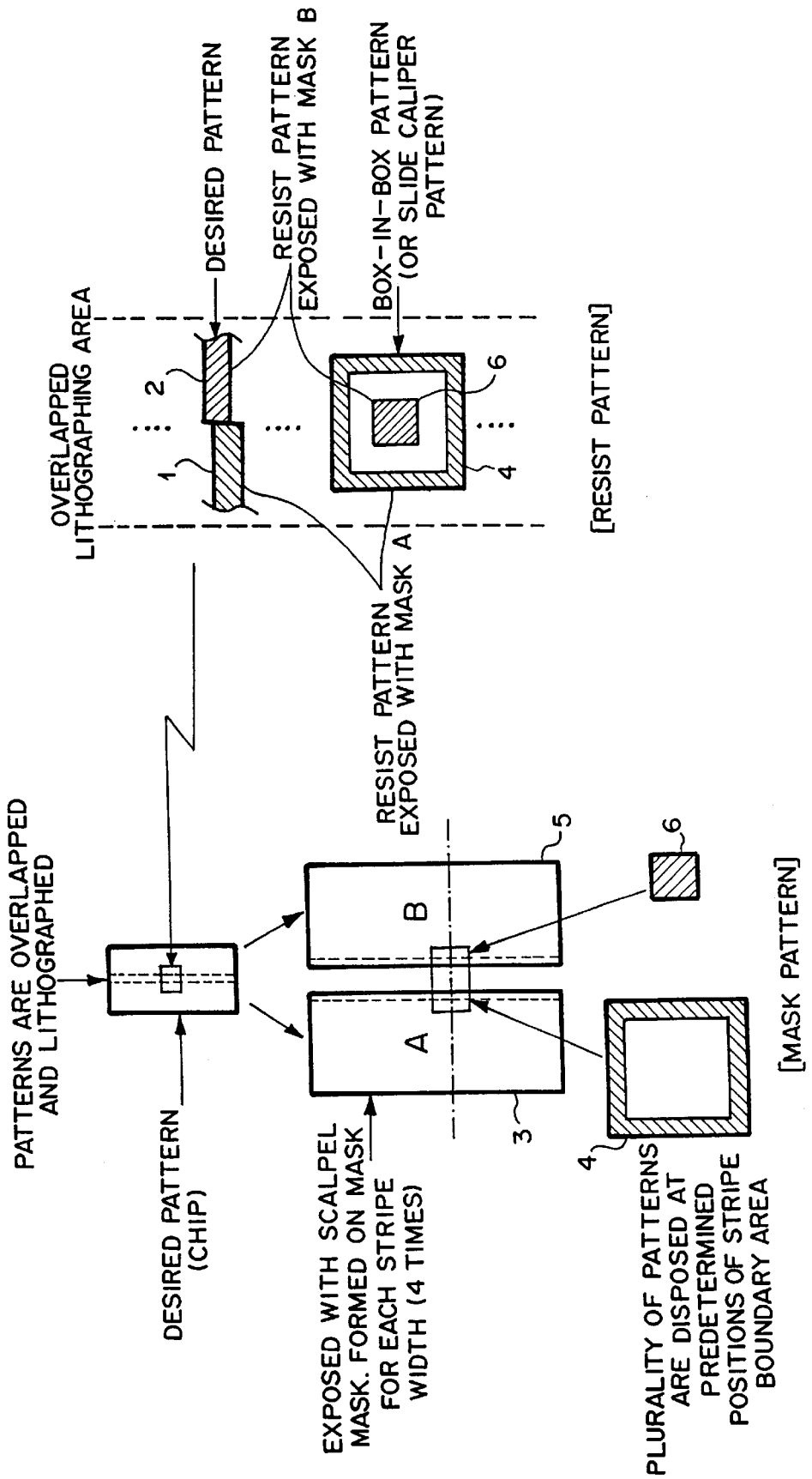
FIG. 3 is a schematic diagram for explaining an electron beam lithographing method according to an embodiment of the present invention.

Next, with reference to the accompanying drawings, an embodiment of the present invention will be described. FIG. 3 shows a mask pattern and an exposed resist pattern. The mask pattern and the exposed resist pattern are disposed to the strutted mask 11 as shown in FIGS. 1A and 1B. In a stripe connection boundary area (having a width of around 10 to 20 $\mu$m), desired mask patterns 1 and 2 are formed with an EB (Electron Beam) mask A-3 and an EB mask B-5. In addition, on the EB mask A-3, a □-shaped connection inspection box mark 4 (having a width of around 5 to 10 $\mu$m) is formed. Likewise, on the EB mask B-5, a square-shaped connection inspection box mark 6 (having a width of around 5 to 10 $\mu$m) is formed. In this case, a plurality of □-shaped connection inspection box marks 4 and a plurality of square-shaped connection inspection box mark 6 are disposed at predetermined positions in the stripe connection boundary area.

In this case, the stripe connection area is a boundary of connections of stripes of which a real chip is scanned and exposed for each stripe area having a width of 250 $\mu$m. As shown in FIG. 3, a box-in-box pattern 6, 4 is a pattern of which a square pattern is overlapped with a □-shaped pattern. When a connection error is measured, a light beam is scanned on the box-in-box pattern 6, 4. In other words, the box-in-box 6, 4 is a pattern composed of a square pattern and a hollowed square that surrounds the square pattern. Instead of the box-in-box pattern 6, 4, a slide caliper pattern may be used. The slide caliper pattern is a vernier pattern. As with a size measuring slide caliper, the slide caliper pattern has a shape of which a part of a □ is cut. By connecting two patterns having different pitches, an error is measured. In other words, the slide caliper pattern is composed of a main scale pattern and a sub scale pattern. Corresponding to the relation of the positions of the main slide pattern and the sub slide pattern, a relative error of the positions of the scales (in this case, a connection error) is measured.

The stripe boundary areas are overlapped and exposed with an electron beam. As with the resist pattern shown in FIG. 3, the connection of the exposed stripes is inspected. By measuring the amount of the connection error and extracting the shift component and rotation component, the obtained data and extracted data are fed back to the main exposing process. In the main exposing process, with the box-in-box pattern 6, 4, the connection of patterns can be inspected.

DESCRIPTION OF OPERATION

Next, with reference to FIG. 4, the operation of the embodiment of the present invention will be described.

FIG. 4 is a flow chart showing steps of the electron beam lithographing method according to the embodiment of the present invention. In FIG. 4, at step S1 as an EB mask forming step), a connection inspection box mark or a slide caliper pattern is placed in the vicinity of a stripe connection boundary area of a desired pattern. Thus, an EB mask is obtained. At step 2 as a pilot lithographing step, with the EB mask, a pilot lithographing process is performed. The slide caliper pattern is a pattern of which two sets of line patterns having different pitches are exposed and with the difference the amount of the deviation (error) is measured.

At step S3 as a measuring step, with the connection inspection box mark or slide caliper pattern, the connection error between exposed stripes is measured. At step 4 as a main exposing step, the connection error is fed back and then the main exposing process is performed. Alternatively, the connection error may be measured several times at step 3. Whenever the connection error is measured, the measured result is fed back to the main exposing process.

At step S5 as an appearance inspecting step, in addition to inspections for the size and overlap accuracy, with the connection inspection box mark or slide caliper pattern, the connection of patterns is inspected. In this case, since the box mark can be measured with a measuring unit, the connections of the patterns can be quantitatively inspected in a short time. In the case of the slide caliper pattern, although it should be manually measured, it can be quantitatively measured with an optical microscope. In this case, since it is not necessary to use a line width measuring SEM that is a vacuum unit, the TAT of the adjustment time becomes shorter than the conventional method.

According to the electron beam lithographing method of the embodiment of the present invention comprising the steps of (a) forming a plurality of accuracy evaluation patterns and a desired pattern in a stripe connection boundary area so as to form an electron beam mask, (b) lithographing patterns with the electron beam mask, (c) measuring connection errors of the exposed stripes with the accuracy evaluation patterns, (d) exposing the patterns with the electron beam, and (e) inspecting the connections of the pattern that has been exposed. Thus, the following effect can be obtained.

In the electron beam lithographing method according to the present invention, a plurality of accuracy evaluation patterns (box marks and slide caliper patterns) and a desired pattern are formed at a stripe boundary (exposed area) of a full transfer type or large area transfer type electron beam mask. With the electron beam mask, the stripe connected portions are overlapped and exposed. Thus, by quantitatively measuring accuracy evaluation patterns such as box marks or slide caliper patterns using an optical microscope or an automatic measuring unit, the connection adjustment time of exposed strips can be shortened and the connection accuracy can be improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method for forming a desired pattern on a surface with an electron beam, the method comprising the steps of:
   projecting an electron beam through a first mask boundary area and onto a surface where a part of the desired pattern is to be formed, the first mask boundary area including a first mask portion of the desired pattern and a first accuracy evaluation element;
   projecting an electron beam through a second mask boundary area and onto the surface so that a projection of the electron beam through the second mask boundary area on the surface overlaps a projection of the electron beam through the first mask boundary area on the surface, the second mask boundary area having a second mask portion of the desired pattern and a second accuracy evaluation element,
   the overlapping projections of the electron beams through the first and second accuracy evaluation elements merging to form a complete accuracy evaluation pattern on the surface,
   the overlapping projections of the electron beams through the first and second mask portions of the desired pattern merging to form the part of the desired pattern on the surface when the first and second mask boundary areas are aligned; and
   measuring an alignment of the first and second mask boundary areas by measuring an alignment of the complete accuracy evaluation pattern on the surface.

2. The method of claim 1, wherein the first accuracy evaluation element is an annular border and the second accuracy evaluation element is a corresponding shape that fits entirely within the annular border when the first and second mask boundary areas are aligned.

3. The method of claim 1, wherein the first accuracy evaluation element is a first slide caliper and the second accuracy evaluation element is a corresponding second slide caliper that abuts the first slide caliper when the first and second mask boundary areas are aligned.

4. The method of claim 1, further comprising the step of realigning the first and second boundary areas based on the measured alignment of the complete accuracy evaluation pattern on the surface.

5. The method of claim 1, wherein the first mask boundary area and the second mask boundary area are on opposite edges of one mask.

6. The method of claim 1, wherein the first mask boundary area and the second mask boundary area are on edges of separate masks.

7. The method of claim 2, wherein the annular border is a first square and the corresponding shape is a second square that is smaller than the first square.

8. A device for forming a desired pattern on a surface with an electron beam, the device comprising:
   a projector that projects an electron beam through a first mask boundary area and onto a surface where a part of the desired pattern is to be formed, where said first mask boundary area includes a first mask portion of the desired pattern and a first accuracy evaluation element;
   said projector also projecting an electron beam through a second mask boundary area and onto said surface so that a projection of the electron beam through said second mask boundary area on said surface overlaps a projection of the electron beam through said first mask boundary area on said surface, where said second mask boundary area includes a second mask portion of the desired pattern and a second accuracy evaluation element,
   the overlapping projections of the electron beams through said first and second accuracy evaluation elements merging to form a complete accuracy evaluation pattern on said surface,
   the overlapping projections of the electron beams through said first and second mask portions of the desired pattern merging on said surface to form the part of the desired pattern on said surface when said first and second mask boundary areas are aligned; and
   a measurement device that measures an alignment of said first and second mask boundary areas by measuring an alignment of said complete accuracy evaluation pattern on said surface.

9. The device of claim 8, wherein said first accuracy evaluation element is an annular border and said second accuracy evaluation element is a corresponding shape that fits entirely within said annular border when said first and second mask boundary areas are aligned.

10. The device of claim 8, wherein said first accuracy evaluation element is a first slide caliper and said second accuracy evaluation element is a corresponding second slide caliper that abuts said first slide caliper when said first and second mask boundary areas are aligned.

11. The device of claim 8, further comprising means for realigning said first and second boundary areas based on the measured alignment of said complete accuracy evaluation pattern on said surface.

12. The device of claim 8, wherein said first mask boundary area and said second mask boundary area are on opposite edges of one mask.

13. The device of claim 8, wherein said first mask boundary area and said second mask boundary area are on edges of separate masks.

14. The device of claim 9, wherein said annular border is a first square and said corresponding shape is a second square that is smaller than said first square.

* * * * *